US008451015B2

(12) United States Patent
Nielsen et al.

(10) Patent No.: US 8,451,015 B2
(45) Date of Patent: May 28, 2013

(54) METHOD FOR MAKING ELECTRICAL TEST PROBE CONTACTS

(75) Inventors: Christian S. Nielsen, River Falls, WI (US); Timothy T. Bomstad, Invergrove Heights, MN (US)

(73) Assignee: Medtronic, Inc., Minneapolis, MN (US)

( * ) Notice: Subject to any disclaimer, the term of this patent is extended or adjusted under 35 U.S.C. 154(b) by 620 days.

(21) Appl. No.: 12/512,838

(22) Filed: Jul. 30, 2009

(65) Prior Publication Data
US 2011/0025356 A1 Feb. 3, 2011

(51) Int. Cl.
*G01R 31/20* (2006.01)
(52) U.S. Cl.
USPC ............. 324/754.1; 324/754.13; 324/754.2; 324/762.01
(58) Field of Classification Search
USPC ............ 324/754.1, 754.13, 754.2, 762.01
See application file for complete search history.

(56) References Cited

U.S. PATENT DOCUMENTS

| | | | | |
|---|---|---|---|---|
| 4,280,195 A | * | 7/1981 | Rose | 365/39 |
| 5,773,987 A | * | 6/1998 | Montoya | 324/754.2 |
| 5,825,192 A | * | 10/1998 | Hagihara | 324/756.03 |
| 6,023,171 A | * | 2/2000 | Boyette et al. | 324/755.07 |
| 6,404,213 B2 | * | 6/2002 | Noda | 324/755.11 |
| 6,801,424 B1 | | 10/2004 | Nielsen et al. | |
| 7,061,259 B2 | * | 6/2006 | Iino et al. | 324/754.07 |
| 7,472,584 B2 | * | 1/2009 | Seo et al. | 73/54.25 |
| 2003/0098700 A1 | * | 5/2003 | Yoshida et al. | 324/754 |
| 2007/0257687 A1 | * | 11/2007 | Leon | 324/754 |

OTHER PUBLICATIONS

"Kelvin (4-Wire) Resistance Measurement," www.allaboutcircuits.com/vol_1/chpt_8/9.html; pp. 1-7.
"The Four Point Electrical Probe," www.users.qwest.net/~csconductor/Experiment_Guide/Four%20Point%20Probe.htm; pp. 1-3.

* cited by examiner

*Primary Examiner* — Arleen M Vazquez
(74) *Attorney, Agent, or Firm* — Carol F. Barry

(57) ABSTRACT

A method of testing an electrical component includes coupling the electrical component to at least a first probe, a second probe, and a third probe. The probes are in communication with a test control module. Furthermore, the method includes confirming that the probes are in sufficient electrical connection with the electrical component by allowing the test control module to supply a current through the electrical component via the first probe and the third probe, and simultaneously detecting a potential difference across the electrical component by the second probe and the third probe. Furthermore, the method includes testing a performance characteristic of the electrical component by supplying a redundant signal to the electrical component via at least two of the first probe, the second probe, and the third probe.

21 Claims, 5 Drawing Sheets

METHOD FOR MAKING ELECTRICAL TEST PROBE CONTACTS

FIELD

The present disclosure relates to electrical testing and, in particular, a method for making electrical test probe contacts.

INTRODUCTION

Electrical components, such as energy storage devices (e.g., capacitors, batteries, etc.), can be electrically tested to determine certain performance characteristics (e.g., charge time, discharge time, charging efficiency, equivalent series resistance, capacitance, capacity, discharge behavior, etc.). Testing can occur during development and design of the electrical component, during manufacturing of the component, and the like. As such, the manufacturer can determine whether or not the component will perform according to desired specifications, and high quality control can be maintained.

Electrical testing can be a time consuming and cumbersome task. For instance, the electrical component may have to be manually connected to and disconnected from test probes of a testing module. Also, it can be difficult to ensure that the test probes are, in fact, electrically connected to the component, especially if the component is covered by an insulator. More specifically, although the probe is mechanically coupled to the component, the probe may not sufficiently penetrate the insulator cover to electrically connect to the conductive core of the component. As such, the test result may indicate false-positive results (i.e., that the component is faulty) when, in fact, the probes are merely electrically disconnected from, or poorly connected to, the component. Thus, in some exemplary embodiments, testing procedures may include confirming that the probes are electrically connected to the component before the actual performance testing begins. Accordingly, testing can be burdensome, requiring extensive set up times, connection of a relatively large number of probes, etc.

The present teachings provide various methods and devices for electrically testing electrical components in a convenient and accurate manner. Furthermore, the present teachings provide various methods and devices for confirming that a test module is electrically connected to the electrical component to reduce likelihood of false-positive test results.

SUMMARY

This section provides a general summary of the disclosure, and is not a comprehensive disclosure of its full scope or all of its features.

Various exemplary embodiments of a method of testing an electrical component according to the present teachings are disclosed. The method includes coupling the electrical component to at least a first probe, a second probe, and a third probe. The first probe, the second probe, and the third probe is in communication with a test control module. Furthermore, the method includes confirming that the first probe, the second probe, and the third probe are in sufficient electrical connection with the electrical component by allowing the test control module to supply a current through the electrical component via the first probe and the third probe, and simultaneously detecting a potential difference across the electrical component by the second probe and the third probe. Furthermore, the method includes testing a performance characteristic of the electrical component by supplying a redundant signal to the electrical component via at least two of the first probe, the second probe, and the third probe.

The present teachings also provide a testing apparatus for performing an electrical test on an electrical component. The testing apparatus includes a first probe, a second probe, and a third probe. The apparatus further includes a test control module that is in communication with the first probe, the second probe, and the third probe. Furthermore, the apparatus includes a switch that changes the test control module between a first setting and a second setting. The first setting allows the test control module to supply a current through the electrical component via the first probe and the third probe, and to simultaneously detect a potential difference across the electrical component via the second probe and the third probe. Thus, the first setting allows the test control module to confirm sufficient electrical connection between the electrical component and the first probe, the second probe, and the third probe. The second setting allows at least two of the first probe, the second probe, and the third probe to be held at a common potential to supply a redundant signal to the electrical component to thereby test a performance characteristic of the electrical component.

Moreover, the present teachings provide a testing apparatus for testing an electrical component. The electrical component has an electrically conductive portion covered by an electrically insulating portion. The testing apparatus includes a test control module, a base, and a probe with an elongate edge. The elongate edge defines an axis and the probe is movably coupled to the base. The probe is in electrical communication with the test control module. Furthermore, the edge penetrates the electrically insulating portion as the electrical component moves relative to the elongate edge along the axis and as the probe moves relative to the base.

Additionally, the present teachings provide a method of testing a capacitor having an anode with an electrically conductive lead. The lead includes an electrically conductive portion that is covered by an electrically insulating portion. The method includes moving the lead relative to a first probe, a second probe, and a third probe. The first, second, and third probes are resiliently and movably coupled to a base. Furthermore, the method includes resiliently moving the first, second, and third probes relative to the base to cut the insulating portion with a first edge of the first probe, a second edge of the second probe, and a third edge of the third probe. Moreover, the method includes confirming that the first, second, and third probes are in sufficient electrical connection with the electrically conductive portion by supplying a current through the lead via the first and third probes while simultaneously detecting a potential difference across the lead via the second and third probes. Still further, the method includes testing at least one of a charge time, a discharge time, an energy storage efficiency, an equivalent series resistance, and a capacitance of the capacitor by supplying a redundant signal to the lead via the first, second, and third probes while the first, second, and third probes are held at a common potential.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected exemplary embodiments and not all possible implementations, and are not intended to limit the scope of the present disclosure.

Corresponding reference numerals indicate corresponding parts throughout the several views of the drawings.

DETAILED DESCRIPTION

Exemplary embodiments will now be described more fully with reference to the accompanying drawings.

Figure 1:
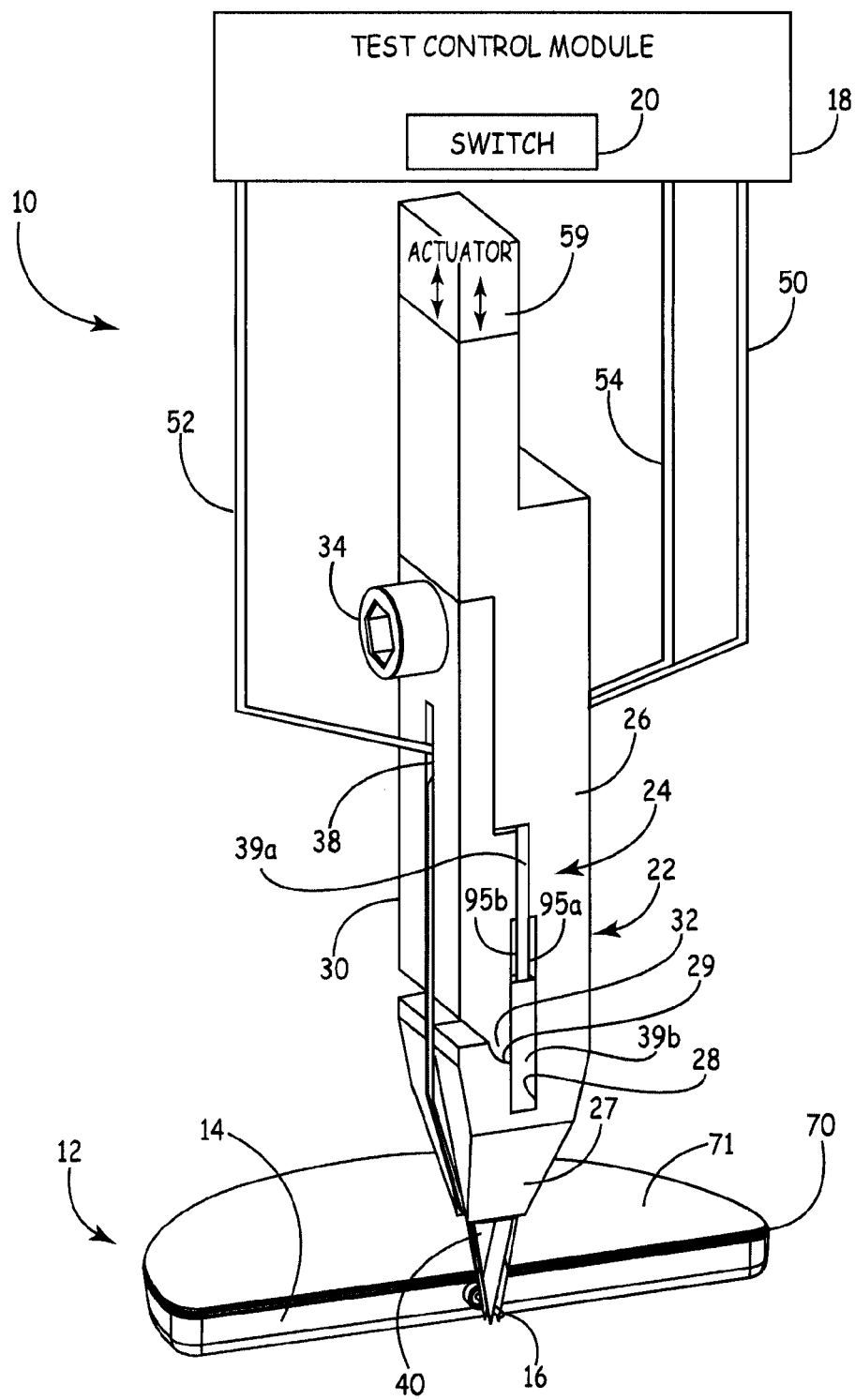
FIG. 1 is a perspective view of a testing apparatus according to various exemplary embodiments of the present disclosure.
Figure 2:
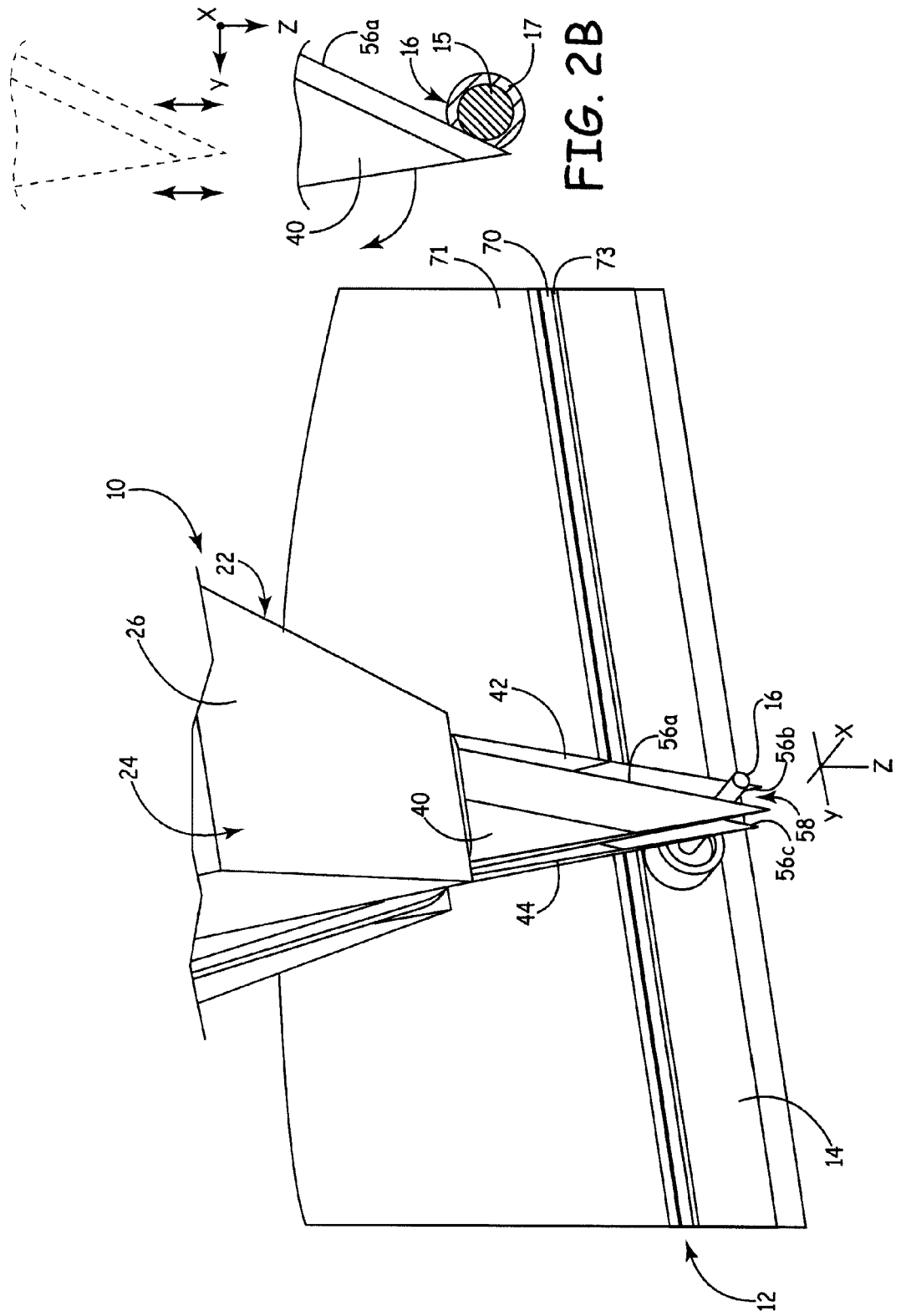
FIG. 2A is a perspective detail view of the testing apparatus of FIG. 1.
FIG. 2B is a sectional detail view of the testing apparatus of FIG. 1.
Figure 3:
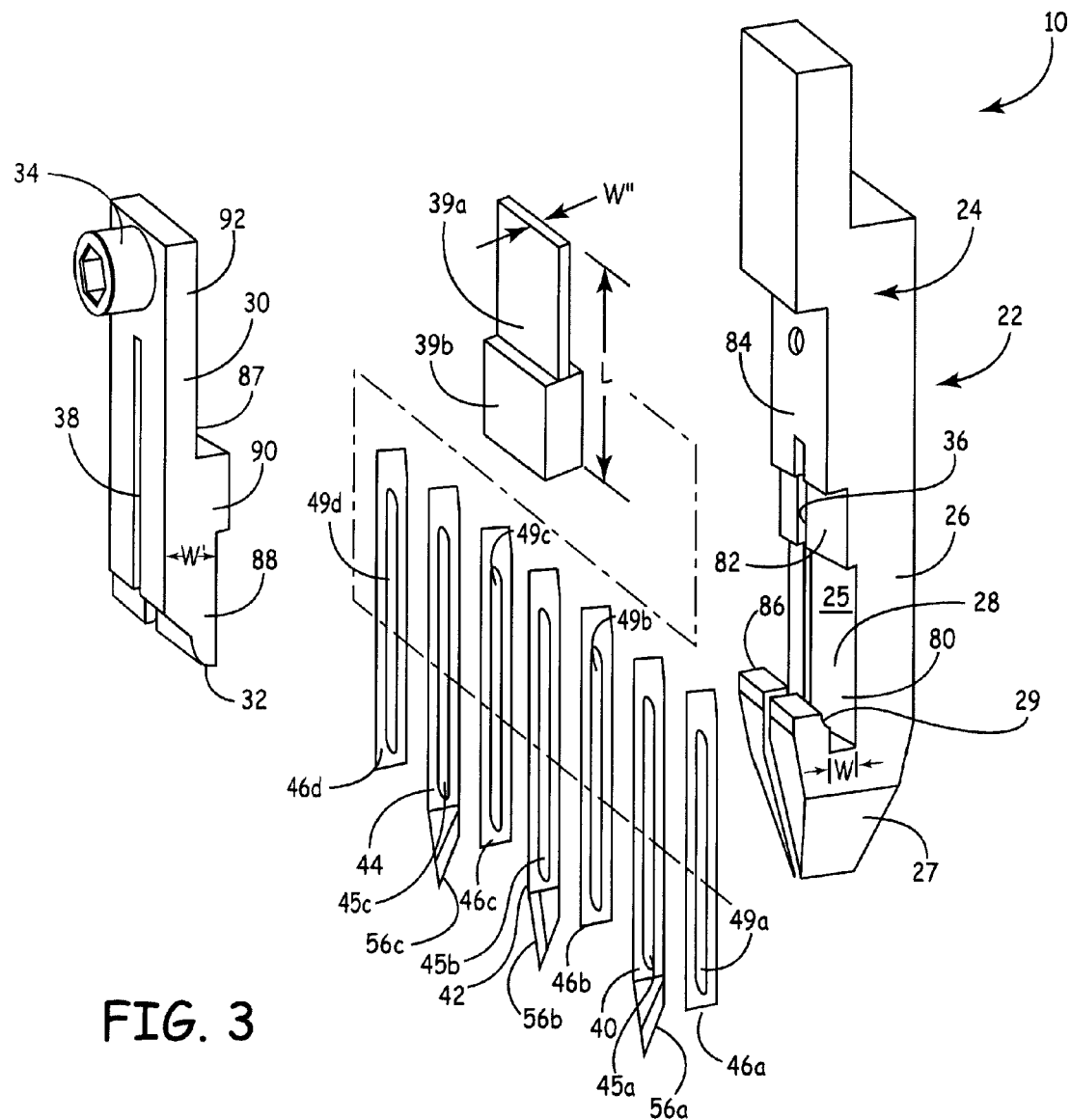
FIG. 3 is a perspective exploded view of the testing apparatus of FIG. 1.

Referring initially to FIGS. 1, 2A, and 3, a testing apparatus 10, according to various exemplary embodiments is shown. As will be discussed, the testing apparatus 10 can be used for testing an electrical component 12.

The electrical component 12 can be of any suitable type. For instance, the electrical component 12 can be an energy storage device, such as a capacitor or a battery, for use within an implantable medical system. For instance, the electrical component 12 can be an energy storage device for use within a cardiac device, such as an implantable pacemaker or defibrillator system. However, it will be appreciated that the electrical component 12 can be suitable for any electrical device other than an energy storage device.

In some exemplary embodiments, the electrical component 12 includes an anode 14 with a lead 16 (i.e., slug) extending therefrom. The electrical component 12 can also include a cathode 70, a separator 73 (FIG. 2A) that is disposed between the anode 14 and cathode 70, a cover or case 71, and the like.

The anode 14 can be made out of any suitable material and can have any suitable shape. Furthermore, the lead 16 can be made out of any suitable material and can have any shape. In some exemplary embodiments, for instance, the lead 16 can be a relatively short wire made of tantalum. Furthermore, as shown in FIG. 2B, the lead 16 can include an electrically conductive portion 15, which is coated with or otherwise covered by an electrically insulating portion 17. For instance, in some exemplary embodiments, the insulating portion 17 can be an anodized coating, such as a tantalum oxide.

Figure 4:
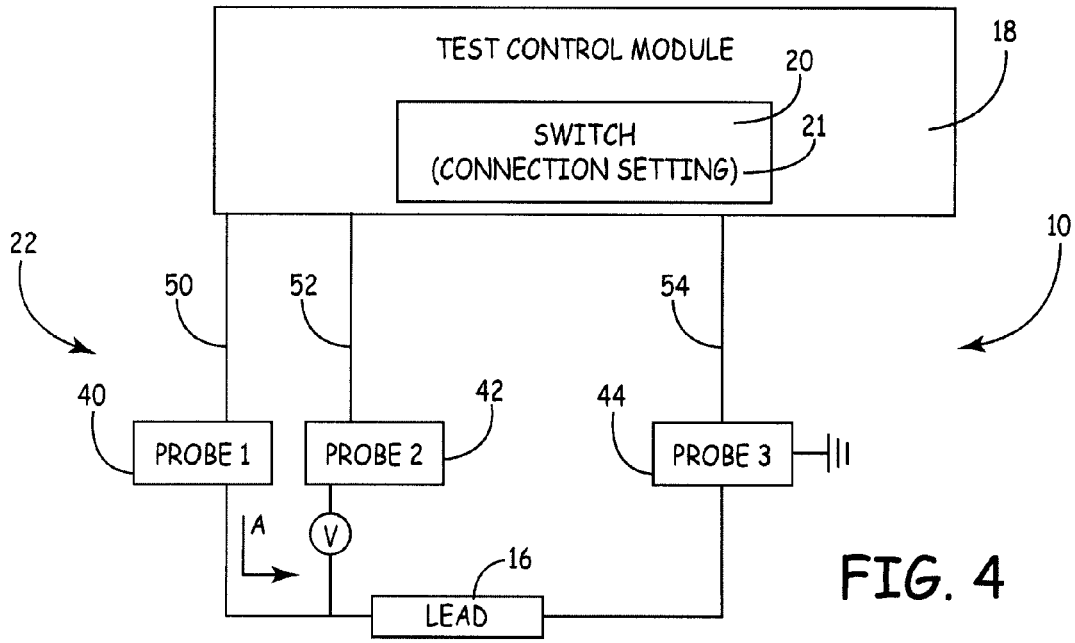
FIG. 4 is a schematic view of the testing apparatus of FIG. 1 in a first setting.
Figure 5:
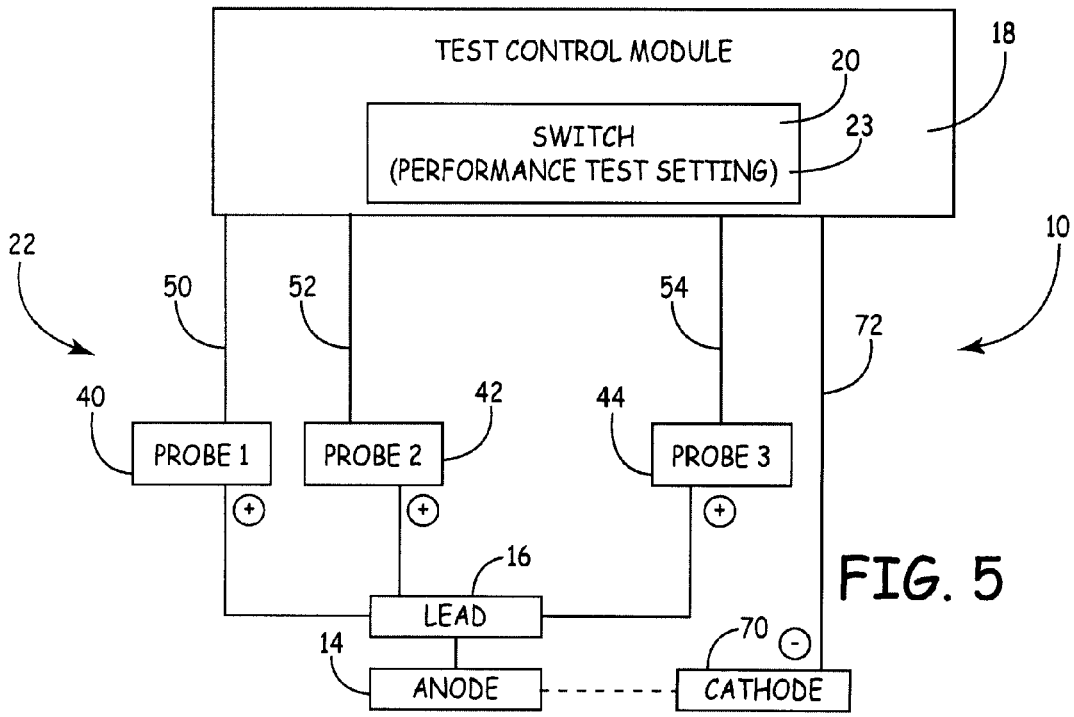
FIG. 5 is a schematic view of the testing apparatus of FIG. 1 in a second setting.

As shown in FIGS. 1, 4 and 5, the testing apparatus 10 can include a test control module 18. The test control module 18 can include various computer hardware (e.g., monitor(s), keyboard, memory storage devices, etc.) and software for running various electrical tests on the electrical component 12, as will be discussed in greater detail below. The test control module 18 can also include a switch 20. The switch 20 can be of any suitable type, and the test control module 18 can include a plurality of switches 20 in some exemplary embodiments. The switch 20 can include a plurality of settings for changing the electrical test that is conducted by the test control module 18. For example, the switch 20 can include a first setting 21 (FIG. 4) for confirming that the test control module 18 is electrically coupled to the lead 16 of the electrical component 12. The switch 20 can also include a second setting 23 (FIG. 5) for testing a performance characteristic of the electrical component 12. For example, in some exemplary embodiments related to a capacitor, the test control module 18 can detect a charge time, a discharging time or other discharging characteristics, energy storage efficiency, an equivalent series resistance (ESR), capacitance, and/or capacity of the electrical component 12 when the switch 20 is in the second setting. Accordingly, as will be discussed, the testing apparatus 10 can conveniently confirm electrical connection to the electrical component 12, and then the testing apparatus 10 can conveniently test the performance characteristics of the electrical component 12.

As shown in FIGS. 1 and 3, the testing apparatus 10 can also include a head assembly 22. The head assembly 22 can include a base 24, which includes a first support frame member 26. The first support frame member 26 can be generally elongate and block shaped with a first surface 25 and a tapered end 27. The first surface 25 can include a recess 28 as shown in FIG. 3. The recess 28 can include a first portion 80, a second portion 82, and a third portion 84. The first portion 80 can be adjacent the tapered end 27, and the second portion 82 can be disposed between the first and third portions 80, 84. The first portion 80 can have a width W (FIG. 3) that is greater than that of the second portion 82, and the width of the second portion 82 can be greater than that of the third portion 84.

The first support frame member 26 can also include a hook portion 86 that is disposed opposite the first surface 25 and that extends away from the tapered end 27. The hook portion 86 can include a notch 29 directly opposite the first surface 25. The notch 29 can be at least partially rounded.

The base 24 can also include a second support frame member 30. As shown in FIG. 3, the second support frame member 30 can be elongate with a surface 87. The second support frame member 30 can also include a first portion 88, a second portion 90, and a third portion 92. The second portion 90 can be disposed between the first and third portions 88, 92. The first portion 88 can have a width W' that is less than that of the second portion 90, and the second portion 90 can have a width W' that is greater than that of the third portion 92. The first portion 88 can also include a flange 32 that extends from an end that is opposite the second portion 90. The flange 32 can have a shape corresponding to the notch 29.

The second support frame member 30 can be removably coupled to the first support frame member 26. For instance, the flange 32 can be received within the notch 29 of the first support frame member 26. Also, a fastener 34, such as a bolt, can extend through the second support frame member 30 and threadably engage the first support frame member 26 to thereby removably couple the first and second support frame members 26, 30.

Additionally, the first support frame member 26 can include a first groove 36, and the second support frame member 30 can define a second groove 38 (FIG. 3). The first and second grooves 36, 38 can extend longitudinally from the tapered end 27 on the first and second support frame members 26, 30, respectively, and the first and second grooves 36, 38 can be aligned when the first and second support frame members 26, 30 are coupled.

The base 24 can also include a first resilient member 39a and a second resilient member 39b. The resilient members 39a, 39b can be made out of any suitable material, such as an elastomer that is electrically insulating. The resilient members 39a, 39b can be thin and sheet-like. The resilient members 39a, 39b can be fixed together end to end. In some embodiments, the resilient members 39a, 39b can be integrally connected so as to be monolithic. Furthermore, the width W" of the first resilient member 39a can be less than that of the second resilient member 39b.

Moreover, the head assembly 22 can include a plurality of probes including a first probe 40, a second probe 42, and a third probe 44. As will be discussed, the probes 40, 42, 44 can be electrically connected to the test control module 18 and to the lead 16 of the electrical component 12 for testing purposes. It will be appreciated that the testing apparatus 10 can include any suitable number of probes (i.e., more or less than three) without departing from the scope of the present disclosure.

Each of the probes 40, 42, 44 can be generally thin and elongate as shown in FIG. 3. Also, the probes 40, 42, 44 can be made out of electrically conductive material, such as a carbon steel. The probes 40, 42, 44 can each include a respective opening 45a, 45b, 45c.

Moreover, the testing apparatus 10 can include a plurality of insulating layers 46a, 46b, 46c, 46d. The insulating members 46a-46d can be thin and elongate and can each include a respective opening 49a, 49b, 49c, 49d.

In order to assemble the head assembly 22 (FIG. 3), the insulating layer 46b can be layered between the first and second probes 40, 42 and the insulating layer 46c can be layered between the second and third probes 42, 44. The insulating layer 46a can be layered over the first probe 40 on a side opposite the insulating layer 46b, and the insulating layer 46d can be layered over the third probe 44 on a side opposite the insulating layer 46c. As such, the openings 45a, 45b, 45c of the probes 40, 42, 44 and the openings 49a, 49b, 49c, 49d should be substantially aligned. Also, the probes 40, 42, 44 can be electrically insulated from each other and from the first and second support frame members 26, 30 as will be discussed.

Then, the resilient members 39a, 39b can be received within and extend through the openings 45a, 45b, 45c, 49a, 49b, 49c, 49d. In some embodiments, the width W" of the second resilient member 39b is slightly greater than that of the openings 45a, 45b, 45c, 49a, 49b, 49c, 49d, and the combined length L of the resilient members 39a, 39b are slightly greater than that of the openings 45a, 45b, 45c, 49a, 49b, 49c, 49d such that the probes 40, 42, 44 and insulating layers 46a-46d are substantially fixed to the resilient members 39a, 39b.

Next, the resilient members 39a, 39b can be received within the recess 28 of the first support frame member 26 such that the layered probes 40, 42, 44 and insulating layers 46a-46d are disposed within the groove 36. The probes 40, 42, 44 can partially extend out from the groove 36.

Subsequently, the second support frame member 30 can be removably coupled to the first support frame member 26. As mentioned above, the flange 32 can be received within the notch 29, and the fastener 34 can extend through the second support frame member 30 to engage the first support frame member 26.

It will be appreciated that once the frame support members 26, 30 are coupled, the resilient members 39a, 39b are sandwiched between and coupled to the frame support members 26, 30. More specifically, first portion 80 of the first frame support member 26 and the first portion 88 of the second frame support member 30 abut respective sides of the second resilient member 39b. Also, the second portion 82 of the first frame support member 26 and the second portion 90 of the second frame support member 30 abut respective sides of the first resilient member 39a. By tightening the fastener 34, the resilient members 39a, 39b can be substantially fixed to the frame support members 26, 30.

As shown in FIG. 1, the dimensions of the resilient members 39a, 39b can be such that gaps 95a, 95b are defined on either side of the first resilient member 39a. Specifically, the gap 95a can be defined between the first resilient member 39a and the first portion 80 (FIG. 3) of the first frame support member 26, and the gap 95b can be defined between the first resilient member 39a and the first portion 88 of the second frame support member 30.

Accordingly, the probes 40, 42, 44 can be movably coupled to the base 24. More specifically, because the probes 40, 42, 44 are disposed within the first and second grooves 36, 38 of the frame members 26, 30, the probes 40, 42, 44 can resiliently deflect relative to the base 24, and the resilient members 39a, 39b can resiliently return the probes 40, 42, 44 to their original position as will be discussed in greater detail below. Accordingly, as will be discussed, a force can be applied to one or more of the probes 40, 42, 44, thereby causing the resilient members 39a, 39b to resiliently deflect, and allowing the probes 40, 42, 44 to resiliently pivot relative to the base 24.

In addition, the testing apparatus 10 can include a first connector 50 that extends and electrically connects the test control module 18 to the first probe 40. The first connector 50 can extend from the test control module 18, into the first groove 36 in order to electrically connect to the first probe 40. The testing apparatus 10 can similarly include a second connector 52, which electrically connects the test control module 18 to the second probe 42. The second connector 52 can extend into the second groove 38 in order to electrically connect to the second probe 42. Moreover, the testing apparatus 10 can include a third connector 54 that electrically connects the test control module 18 to the third probe 44. The third connector 54 can extend into the first groove 36 in order to electrically connect to the first probe 44.

As shown in FIG. 2A, each of the probes 40, 42, 44 can include a corresponding sharpened edge 56a, 56b, 56c. It will be appreciated that the edges 56a, 56b, 56c could be serrated or could include respective saw teeth or abrasive, and the like. The sharpened edges 56a, 56b, 56c can each have a straight axis. Also, the edges 56a, 56b, 56c can be disposed at a positive angle relative to the respective axis of the probe 40, 42, 44.

As shown in FIG. 2A, the probes 40, 42, 44 can be layered (with the insulating members 46a-46d therebetween) such that the edges 56a, 56b, 56c are spaced apart from each other in a first direction X. Also, the first and third edges 56a, 56c can be substantially parallel to each other and disposed opposite the second edge 56b in a second direction Y, which is perpendicular to the first direction X. Accordingly, a space 58 can be defined between the edges 56a, 56b, 56c of the probes 40, 42, 44. As will be discussed, the space 58 can receive the lead 16 of the electrical component 12 for testing purposes.

Thus, to perform testing of the electrical component 12, the electrical component 12 can be supported on a stationary platform (not shown), and the first support frame member 26 can be operably secured to an actuator 59 (FIG. 1). The actuator 59 can be of any suitable type, such as a linear actuator that is automated and controlled by the test control module 18. Furthermore, the actuator 59 can reciprocate in order to move the head assembly 22 relative to the electrical component 12. It will be appreciated that, in some exemplary embodiments, the head assembly 22 can remain stationary and the electrical component 12 can be actuated in order to move the head assembly 22 relative to the electrical component 12. Furthermore, the head assembly 22 and the electrical component 12 can each be coupled to an actuator for relative movement of the head assembly 22 and the electrical component 12.

As shown in FIG. 2B, the actuator 59 can actuate the head assembly 22 toward the lead 16 in a third direction Z, which is perpendicular to both the first and second directions X, Y. As the lead 16 enters the space 58 between the probes 40, 42, 44, the edges 56a, 56b, 56c of the probes 40, 42, 44 eventually abut and begin to penetrate the electrically insulating portion 17 of the lead 16. More specifically, as the probes 40, 42, 44 advance in the third direction Z, the probes 40, 42, 44 each resiliently pivot about the first direction X (as represented by a curved arrow in FIG. 2B) and the edges 56a, 56b, 56c cut, displace, slice, and advance through the electrically insulating portion 17 of the lead 16. (It will be appreciated that the first and third probes 40, 42 pivot in a direction opposite that of the second probe 42.) Eventually, the edges 56a, 56b, 56c cut entirely through the insulating portion 17 and abut and/or penetrate into the electrically conductive portion 15 of the lead 16. As such, the probes 40, 42, 44 can be in electrical connection with the lead 16 and, thus (in the case of a capacitor), in electrical connection with the anode 14 of the electrical component 12.

It will be appreciated that the actuator 59 can automatically move the head assembly 22 for added convenience during electrical testing. Furthermore, because the probes 40, 42, 44 are resiliently and pivotally connected to the base 24 and because the probes 40, 42, 44 are disposed in spaced relation, the edges 56a, 56b, 56c can more easily move and slice through the electrically insulating portion 17 of the lead 16. This is because the probes 40, 42, 44 can move a substantial amount relative to the lead 16 as the edges 56a, 56b, 56c slice through the insulating portion 17 of the lead 16, and because the probes 40, 42, 44 impart balanced forces on the lead 16. Accordingly, the probes 40, 42, 44 can more easily penetrate the insulating portion 17, and electrical connection is more likely. It will also be appreciated that the electrical testing can occur in a substantially or entirely automated system for added convenience.

Referring now to FIG. 4, a first electrical test is illustrated schematically. More specifically, the switch 20 can be set in the first setting 21 (connection test setting) in order to confirm that the probes 40, 42, 44 are, in fact, in sufficient electrical connection with the lead 16. Then, the test control module 18 can supply a current through the lead 16 via the first probe 40 and the third probe 44. The test control module 18 can simultaneously detect a potential difference (i.e., a voltage drop) across the lead 16 via the second probe 42 and the third probe 44. It will be appreciated that the first probe 40 can have a positive potential, and the third probe 44 can be grounded. Likewise, it will be appreciated that the second probe 42 can have a positive potential, and the third probe 44 can be grounded. Furthermore, it will be appreciated that the electrical testing schematically illustrated in FIG. 4 can be performed according to Kelvin sensing techniques. As such, the current supplied from the first probe 40 can remain substantially constant at a known value. Also, the test control module 18 can detect the potential difference between the second and third probes 42, 44. With this known current and detected voltage drop, the resistance of the lead 16 can be detected according to Ohm's law (R=V/I). Moreover, any voltage drop in the third probe 44 can be compensated by assuming that the voltage drop in the third probe 44 is the same as in the first probe 40. Accordingly, this Kelvin testing can substantially compensate for any contact resistance between the probes 40, 42, 44 and the lead 16, and the electrical connection can be tested with increased accuracy.

Thus, by detecting the resistance within the lead 16, it can be detected whether the probes 40, 42, 44 are sufficiently electrically connected to the lead 16. For instance, if the test control module 18 detects a substantially high resistance (e.g., a resistance greater than expected from the resistivity contribution from the circuit materials), it can be determined that one or more of the probes 40, 42, 44 has not electrically connected to the conductive portion 15 of the lead 16. If this is the detected result, an attempt can be made to sufficiently connect the probes 40, 42, 44, for instance, by further actuating the actuator 59. In contrast, if the detected resistance is relatively low (e.g., R substantially equal to 0), then it can be determined that the probes 40, 42, 44 are in sufficient electrical contact, and performance testing can begin as described in greater detail below.

It will be appreciated that any of the probes 40, 42, 44 can be paired for supplying the current and/or for measuring the potential difference within the lead 16. It will also be appreciated that the testing apparatus 10 can include more than three probes 40, 42, 44 for detecting resistance within the lead 16. For instance, the testing apparatus 10 can include four probes (e.g., two for supplying the current, and two others for detecting the voltage drop across the lead 16). It will also be appreciated that the testing apparatus 10 can include only two probes for a direct measurement of the resistance within the lead 16 and of the contact.

Once electrical connection has been confirmed, the switch 20 can be switched into a second setting 23 (performance test setting) as shown in FIG. 5. As shown, the test control module 18 can supply a redundant signal to the lead 16 via at least two of the probes 40, 42, 44. For instance, in some exemplary embodiments, each of the probes 40, 42, 44 can have an elevated potential to charge and subsequently discharge the electrical component 12 through the lead 16. It will also be appreciated that the plurality of the probes 40, 42, 44 could be grounded in some exemplary embodiments.

As shown in FIG. 5, the test control module 18 can also be separately connected to the cathode 70 of the electrical component 12 via a cathode connector 72. For instance, the cathode connector 72 can be electrically connected directly to the cathode 70, or indirectly to the cathode 70 or via an electrode. Also, in some exemplary embodiments, the case 71 (FIG. 2) can be electrically connected to the cathode 70 while being insulated from the anode 14, and the cathode connector 72 can be electrically connected to the case 73 in order to electrically connect to the cathode 70. Additionally, in some exemplary embodiments, the test control module 18 can electrically connect to the cathode 70 with a separate set of probes that are similar to the probes 40, 42, 44 described hereinabove. Moreover, in some exemplary embodiments, the cathode connector 72 can have a potential that is opposite from the connectors 50, 52, 54.

Accordingly, the test control module 18 can operate the anode 14 and the cathode 70 to charge and/or discharge the electrical component 12. Moreover, the test control module 18 can test the capacitance of the electrical component 12. In cases where the electrical component 12 is a battery, the test control module 18 can test the capacity and discharge characteristics. Also, the test control module 18 can test the amount of time it takes to charge and/or discharge the electrical component 12. The test control module 18 can also detect an amount of time that the anode 14 and cathode 70 hold a charge. Furthermore, the test control module 18 can include software for measuring the energy storage efficiency of the electrical component 12 and/or to measure the equivalent series resistance (ESR), capacity, and/or discharge behavior of the electrical component 12.

It will be appreciated that the probes 40, 42, 44 provide a common electrical connection with redundant mechanically coupled contacts, the probes 40, 42, 44 can supply a redundant signal to the lead 16. As such, proper testing can be ensured. This is because, if one probe 40, 42, 44 fails, the other probe(s) 40, 42, 44 can compensate.

Thus, the testing apparatus 10 conveniently allows the user to confirm that the probes 40, 42, 44 are electrically connected to the lead 16 before performance testing of the electrical component 12 is performed. As such, false-positive results of the performance testing are unlikely. Moreover, the user can easily change the settings of the switch 20 during testing. Furthermore, the setting of the switch 20 can be automated in some exemplary embodiments. Accordingly, the testing apparatus 10 allows for easier, less time consuming, more reliable, and lower maintenance electrical testing.

Figure 6:
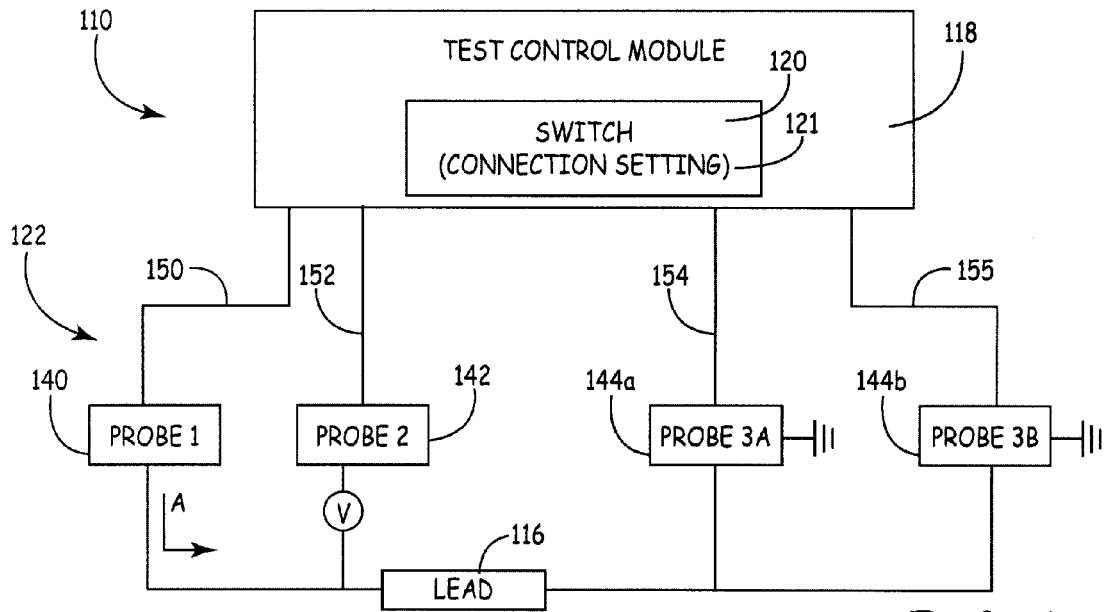
FIG. 6 is a schematic view of a testing apparatus in a first setting according to various other embodiments of the present disclosure.
Figure 7:
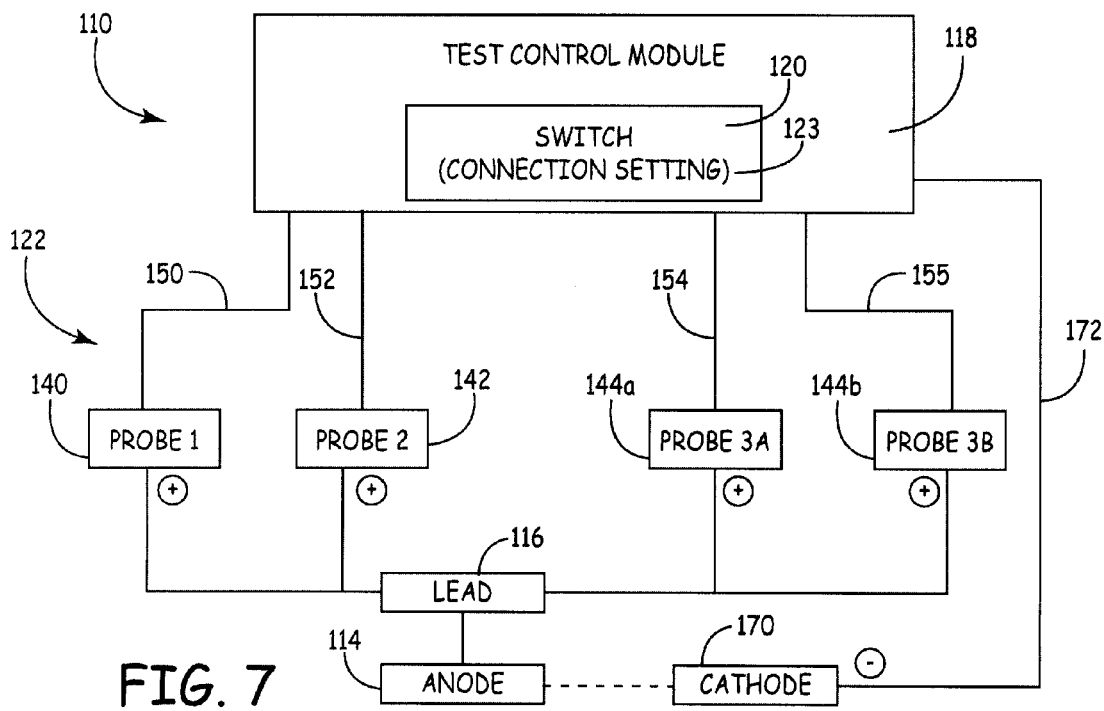
FIG. 7 is a schematic view of the testing apparatus of FIG. 6 in a second setting.

Referring now to FIGS. 6 and 7, other exemplary embodiments are schematically illustrated. It will be appreciated that components similar to the embodiments of FIGS. 1-5 are indicated with similar reference numerals increased by 100.

As shown, the testing apparatus 110 can include a first probe 140 and a second probe 142. The testing apparatus 110 can also include a plurality of third probes, namely a first probe component 144a and a second probe component 144b. The first and second probe components 144a, 144b can be substantially similar in shape as the first and second probes 140, 142. Also, the first probe 140, the second probe 142, the first probe component 144a, and the second probe component 144b can be layered over each other and electrically insulated from each other, similar to the embodiments discussed in relation to FIGS. 1-5. Moreover, the apparatus 110 can include a fourth lead 155 for electrically connecting the second probe component 144b to the test control module 118.

Furthermore, as shown in FIG. 6, when the switch 120 is in the first setting 121 for confirming electrical connection to the lead 116, the first probe 140 and the second probe component 144b can transmit current through the lead 116. Also, potential difference in the lead 116 can be simultaneously measured via the second probe 142 and the first probe component 144a. It will be appreciated that the first and second probe components 144a, 144b can be separately grounded.

Accordingly, the testing apparatus 110 can determine whether or not the first and second probes 140, 142 and the first and second probe components 144a, 144b are in sufficient electrical contact with the lead 116. Also, it will be appreciated that the electrical connections can be tested using four separate connections (i.e., the first and second probes 140, 142 and first and second probe components 144a, 144b) in a conventional Kelvin testing arrangement.

Then, as shown in FIG. 7, the performance characteristics of the anode 114 together with the cathode 170 can be tested with the switch 120 in the second setting 123. The first and second probes 140, 142 and first and second probe components 144a, 144b can each have a similar polarity, similar to the embodiments represented above in FIG. 5. It will be appreciated that the performance characteristics can be suitable for testing the performance of an electrochemical cell, such as a capacitor or battery, and the anode 114 and cathode 170 can be encased together within a common housing. It will also be appreciated that the anode 114 could be tested individually, and the cathode 170 shown in FIG. 7 could be replaced by a simple second connection point.

The foregoing description of the exemplary embodiments has been provided for purposes of illustration and description. It is not intended to be exhaustive or to limit the invention. Individual elements or features of a particular exemplary embodiment are generally not limited to that particular exemplary embodiment, but, where applicable, are interchangeable and can be used in a selected exemplary embodiment, even if not specifically shown or described. The same may also be varied in many ways. Such variations are not to be regarded as a departure from the invention, and all such modifications are intended to be included within the scope of the invention.

Exemplary embodiments are provided so that this disclosure will be thorough, and will fully convey the scope to those who are skilled in the art. Numerous specific details are set forth such as examples of specific components, devices, and methods, to provide a thorough understanding of exemplary embodiments of the present disclosure. It will be apparent to those skilled in the art that specific details need not be employed, that exemplary embodiments may be embodied in many different forms and that neither should be construed to limit the scope of the disclosure. In some exemplary embodiments, well-known processes, well-known device structures, and well-known technologies are not described in detail.

The terminology used herein is for the purpose of describing particular exemplary embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the exemplary embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A testing apparatus for testing at least one electrical component including an electrically conductive portion covered by an electrically insulating portion, the testing apparatus comprising:
   a test control module;
   a base; and
   at least one probe defined along a probe axis comprising a probe end and an elongate edge, wherein the elongate edge is proximate to the probe end and extends at an angle to and along the probe axis,
   the at least one probe being moveably coupled to the base and in electrical communication with the test control module, the elongate edge being configured to penetrate the electrically insulating portion when at least one of the electrical component and the elongate edge is moved relative to the other, and further being configured to come into electrical contact with the electrically conductive portion upon penetration of the elongate edge through the electrically insulating portion.

2. The testing apparatus of claim 1, wherein the base includes a support frame and a resilient member, the resilient member moveably and resiliently coupling the probe with the support frame.

3. The test apparatus of claim 2, wherein the base includes a first support frame member and a second support frame member that is removably coupled to the first support frame member, the resilient member being disposed between the first and second support frame members.

4. The test apparatus of claim 3, wherein the first and second support frame members each include a respective groove, the probe partially disposed within the respective grooves and partially extending out of the respective grooves.

5. The test apparatus of claim 3, wherein the first and second support frame members abut the resilient member, and wherein a gap is defined between the resilient member and at least one of the first and second support frame members.

6. The test apparatus of claim 1, wherein the elongate edge is disposed along an edge axis defined at an angle to the probe axis, and further wherein the elongate edge cuts through the insulating portion as the at least one probe moves along the probe axis.

7. The test apparatus of claim 1, wherein the insulating portion is an anodize layer.

8. The test apparatus of claim 1, wherein the at least one probe comprises a first probe with a first elongate edge proximate a first probe end and a second probe with a second elongate edge proximate a second probe end, the first and second elongate edges being spaced apart from each other to define a space configured to receive the at least one electrical component, wherein each of the first and second elongated edges are configured to penetrate the electrically insulating portion and to come into contact with the electrically conductive portion.

9. The test apparatus of claim 1, wherein the at least one probe comprises carbon steel.

10. The testing apparatus of claim 1, wherein the at least one probe is configured such that all or substantially all of the electrical contact between the at least one probe and the electrically conductive portion occurs at a location along the elongate edge proximate to the probe end of the at least one probe.

11. A testing apparatus for testing an electrical component, the electrical component including an electrically conductive portion covered by an electrically insulating portion, the testing apparatus comprising:
    a test control module; and
    at least a first probe and a second probe, wherein each of the first and second probes are in electrical communication with the test control module, wherein the first probe comprises a first probe end and a first elongate edge and the second probe comprises a second probe end and a second elongate edge, and further wherein at least a portion of each of the first and second elongate edges face in opposing directions and are configured to apply oppositely directed forces on the electrical component to penetrate the electrically insulating portion of the electrical component when the first and second elongate edges are in contact with the electrical component.

12. The testing apparatus of claim 11, wherein each of the first and second elongate edges are configured to come into electrical contact with the electrically conductive portion of the electrical component on opposing regions of the electrical component when the first and second elongate edges penetrate the electrically insulating portion.

13. The testing apparatus of claim 11, wherein the first and second elongate edges are spaced apart from each other to define a space configured to receive the electrical component.

14. The testing apparatus of claim 13, wherein the first and second probes are defined along a probe axis, wherein each of the first and second elongate edges is disposed at an angle relative to the probe axis such that, when the electrical component is being received within the defined space, the first and second elongate edges compress the electrically insulating portion of the electrical component therebetween.

15. The testing apparatus of claim 13, wherein the first and second probes are defined along a probe axis, wherein each of the first and second elongate edges is disposed at an angle relative to the probe axis such that when the electrical component is being received within the defined space, the first and second elongate edges pivot away from each other.

16. The testing apparatus of claim 13, wherein each of the first and second elongate edges comprise a sharpened edge configured to cut the electrically insulating portion when the electrical component is being received within the defined space.

17. The testing apparatus of claim 13, wherein the first and second probes are defined along a probe axis, wherein the first elongate edge extends along a first edge axis and the second elongate edge extends along a second edge axis, and further wherein the first edge axis and the second edge axis are not parallel to the probe axis and are each disposed at an angle relative to the probe axis.

18. The testing apparatus of claim 17, wherein both the first edge axis and second edge axis lie along a line tangential to an outer surface of the electrically insulating portion when the electrical component is being received within the defined space.

19. The testing apparatus of claim 17, further comprising a third probe, wherein the third probe comprises a third probe end and a third elongate edge, wherein the third elongate edge extends along a third edge axis in line with, and at the same angle relative to the probe axis of, either the first edge axis or the second edge axis.

20. A testing apparatus for testing an electrical component, the electrical component including an electrically conductive portion covered by an electrically insulating portion, the testing apparatus comprising:
  a testing control module; and
  a probe assembly defined along a probe axis comprising:
    a first probe disposed along the probe axis, wherein the first probe comprises a first probe end and a first elongate edge extending along a first edge axis disposed at an angle relative to the probe axis;
    a second probe disposed along the probe axis, wherein the second probe comprises a second probe end and a second elongate edge extending along a second edge axis disposed at an angle relative to the probe axis; and
    a third probe disposed along the probe axis wherein the third probe comprises a third probe end and a third elongate edge extending along a third edge axis disposed at an angle relative to the probe axis;
  wherein at least one of the first, second, and third elongate edges faces in an opposing direction to at least one of the other elongate edges,
  wherein each of the first, second and third elongate edges comprise sharpened edges, and further wherein each of the first, second, and third probes are separately in electrical communication with the testing control module.

21. The testing apparatus of claim 20, wherein the first, second, and third probes are operably coupled to an actuator for moving the probe assembly along the probe axis.

* * * * *